(12) United States Patent
Lue et al.

(10) Patent No.: US 10,141,328 B2
(45) Date of Patent: Nov. 27, 2018

(54) THREE DIMENSIONAL MEMORY DEVICE AND METHOD FOR FABRICATING THE SAME

(71) Applicant: MACRONIX INTERNATIONAL CO., LTD., Hsinchu (TW)

(72) Inventors: Hang-Ting Lue, Zhubei (TW); Wei-Chen Chen, Taoyuan (TW)

(73) Assignee: MACRONIX INTERNATIONAL CO., LTD., Hsinchu (TW)

(*) Notice: Subject to any disclaimer, the term of this patent is extended or adjusted under 35 U.S.C. 154(b) by 55 days.

(21) Appl. No.: 15/379,527

(22) Filed: Dec. 15, 2016

(65) Prior Publication Data
US 2018/0175051 A1 Jun. 21, 2018

(51) Int. Cl.
*H01L 27/11582* (2017.01)
*H01L 21/02* (2006.01)

(52) U.S. Cl.
CPC .... *H01L 27/11582* (2013.01); *H01L 21/0217* (2013.01); *H01L 21/02164* (2013.01); *H01L 21/02233* (2013.01); *H01L 21/02255* (2013.01)

(58) Field of Classification Search
CPC ......... H01L 27/11582; H01L 21/02164; H01L 21/0217; H01L 21/02233; H01L 21/02255; H01L 29/792; H01L 27/11563; H01L 29/4234; H01L 29/66833
See application file for complete search history.

(56) References Cited

U.S. PATENT DOCUMENTS

| 7,394,125 | B1 | 7/2008 | Park et al. |
|---|---|---|---|
| 8,120,088 | B1 | 2/2012 | She et al. |
| 9,324,731 | B1* | 4/2016 | Lai .................... H01L 27/11565 |
| 2010/0044778 | A1* | 2/2010 | Seol .................. H01L 21/28273 257/326 |
| 2015/0123191 | A1 | 5/2015 | Purayath et al. |
| 2015/0221666 | A1* | 8/2015 | Lee .................... H01L 29/66833 257/66 |
| 2016/0071871 | A1 | 3/2016 | Kamigaichi |
| 2016/0079068 | A1* | 3/2016 | Ishigaki ............. H01L 29/66833 257/314 |

(Continued)

FOREIGN PATENT DOCUMENTS

| TW | 104113291 | 4/2015 |
|---|---|---|
| TW | 201628165 A | 8/2016 |

OTHER PUBLICATIONS

TIPO Office Action dated Apr. 6, 2017 in Taiwan application (No. 105141566).

*Primary Examiner* — Walter H Swanson
(74) *Attorney, Agent, or Firm* — McClure, Qualey & Rodack, LLP

(57) ABSTRACT

A 3D memory device includes a substrate, a ridge-shaped stack, a memory layer, a channel layer and a capping layer. The ridge-shaped stack includes a plurality of conductive strips extending along a first direction and stacked on the substrate. The memory layer is stacked on a vertical sidewall of the ridge-shaped stack along a second direction that forms a non-straight with the first direction. The channel layer is stacked on the memory layer along the second direction and has a narrow sidewall having a long side extending along the first direction. The capping layer is stacked on the narrow sidewall along a third direction that forms a non-straight angle with the second direction.

8 Claims, 13 Drawing Sheets

(56) References Cited

U.S. PATENT DOCUMENTS

2016/0155511 A1    6/2016  Aritome et al.
2016/0155750 A1*  6/2016  Yasuda ............. H01L 27/11582
                                                               257/324

* cited by examiner

THREE DIMENSIONAL MEMORY DEVICE AND METHOD FOR FABRICATING THE SAME

BACKGROUND

Technical Field

The disclosure in generally relates to a high density memory device and method for fabricating the same, and more particularly to a three dimensional (3D) memory device a method for fabricating the same.

Description of the Related Art

Non-volatile memory (NVM) devices which are able to continually store information even when the supply of electricity is removed from the device containing the NVM cells has been widespread adopted by bulk solid state memory applications in portable audiovisual entertainment devices, cell phones or digital cameras etc. Recently, various 3D memory devices, such as a 3D single gate vertical-channel (SGVC) flash memory device that has a multi-layer stack structure may possess a higher density memory and excellent electrical characteristics, e.g. reliability in data storage and high operating speed, has been provided in order to accommodate the rising demand for superior memory.

A typical method for fabricating a 3D SGVC flash memory device includes steps as follows: A plurality of word line trenches are formed in a multi-layer stack, and a memory layer with an ONO composite layer (including a silicon oxide layer, a silicon nitride layer and another silicon oxide layer) and a poly silicon channel layer are formed in sequence on the bottoms and sidewalls of the word line trenches, so as to define a plurality memory cells connected in series and disposed on the vertical sidewalls of the word line trenches.

However, as semiconductor features shrink in size and pitch, the problems of degradation in electrical properties and memory write/read failure due to corner effect occurring at two lateral edges of each memory cell is getting worse.

Therefore, there is a need of providing an improved 3D memory device and the method for fabricating the same to obviate the drawbacks encountered from the prior art.

SUMMARY

One aspect of the present disclosure is to provide a 3D memory device, wherein the 3D memory device includes a substrate, a ridge-shaped stack, a memory layer, a channel layer and a capping layer. The ridge-shaped stack includes a plurality of conductive strips extending along a first direction and stacked on the substrate. The memory layer is stacked on a vertical sidewall of the ridge-shaped stack along a second direction that forms a non-straight with the first direction. The channel layer is stacked on the memory layer along the second direction and has a narrow sidewall having a long side extending along the first direction. The capping layer is stacked on the narrow sidewall along a third direction that forms a non-straight angle with the second direction.

Another aspect of the present disclosure is to provide a method for fabricating a 3D dimensional memory device, wherein the method includes steps as follows: A ridge-shaped stack including a plurality of conductive strips extending along a first direction are formed to stack on a substrate. Next, a memory layer is formed to stack on a vertical sidewall of the ridge-shaped stack along a second direction that forms a non-straight with the first direction. A channel layer having a narrow sidewall with a long side extending along the first direction is then formed to stack on the memory layer along the second direction. Subsequently, a capping layer is formed to stack on the narrow sidewall along a third direction that forms a non-straight angle with the second direction.

In accordance with the aforementioned embodiments of the present disclosure, a 3D memory device and the method for fabricating the same are provided. A memory layer and a channel layer are formed in sequence on a vertical sidewall of a ridge-shaped stack including a plurality of conductive strips. A lateral narrow sidewall of the channel layer is next etched back. A capping layer is then formed to cover the etched lateral narrow sidewall of the channel layer. Whereby, the lateral narrow sidewall of the channel layer can be separated from the lateral edges of the memory layer, and more electrons can be trapped in the capping layer, and the impact of the corner effect occurring at the lateral edges of the memory layer can be alleviated. As a result, the problems of degradation in electrical properties and memory write/read failure due to the corner effect can be obviated.

BRIEF DESCRIPTION OF THE DRAWINGS

The above objects and advantages of the present disclosure will become more readily apparent to those ordinarily skilled in the art after reviewing the following detailed description and accompanying drawings, in which:

FIG. 5B is a cross-sectional view taken along the line S5 depicted in FIG. 5A;

DETAILED DESCRIPTION

Figure 1:
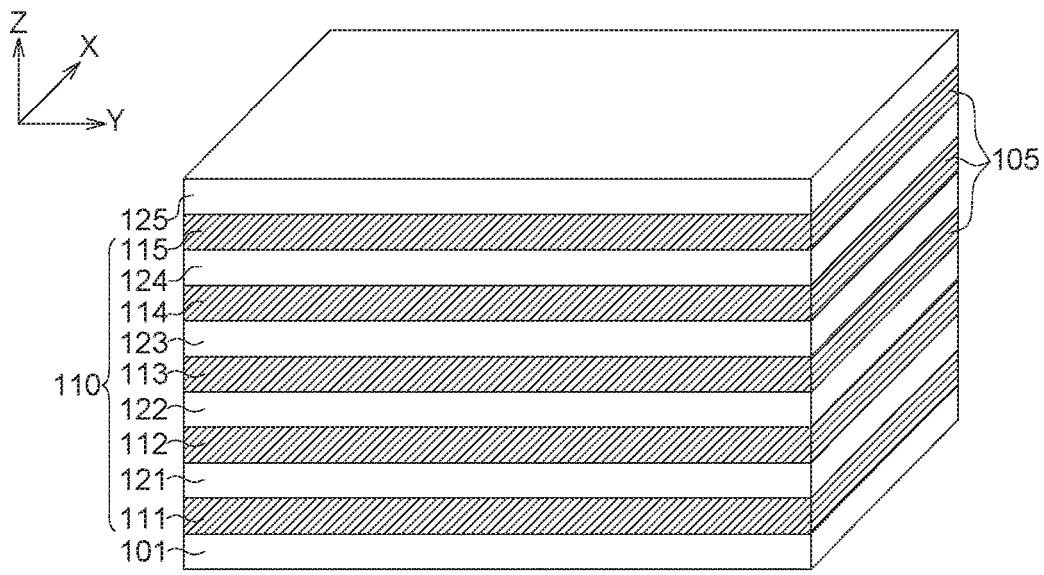
FIG. 1 is a prospective view illustrating a multi-layer stack in accordance with one embodiment of the present disclosure.

The embodiments as illustrated below provide a 3D memory device and the method for fabricating the same to solve the problems of degradation in electrical properties and memory write/read failure due to the corner effect. The present disclosure will now be described more specifically with reference to the following embodiments illustrating the structure and arrangements thereof.

It is to be noted that the following descriptions of preferred embodiments of this disclosure are presented herein for purpose of illustration and description only. It is not intended to be exhaustive or to be limited to the precise form disclosed. Also, it is also important to point out that there may be other features, elements, steps and parameters for implementing the embodiments of the present disclosure which are not specifically illustrated. Thus, the specification and the drawings are to be regard as an illustrative sense rather than a restrictive sense. Various modifications and similar arrangements may be provided by the persons skilled in the art within the spirit and scope of the present disclosure. In addition, the illustrations may not be necessarily be drawn to scale, and the identical elements of the embodiments are designated with the same reference numerals.

The method for fabricating a 3D memory device 100 comprises several steps as follows: Firstly, a multi-layer stack 110 is formed on a substrate 101. FIG. 1 is a prospective view illustrating the multi-layer stack 110 in accordance with one embodiment of the present disclosure. In some embodiments of the present disclosure, the multi-layer stack 110 is formed on a semiconductor substrate 101. The multi-layer stack 110 comprises a plurality of conductive layers 111-115, and a plurality of insulating layers 121-125. In the present embodiment, the insulating layers 121-125 are alternately stacked with the conductive layer 111-115 on the substrate 101 along a first direction (such as the Z-orientation) as illustrated in FIG. 1A. As a result, the conductive layer 111 is disposed at the bottom of the multi-layer stack 110, and the insulating layer 125 is disposed at the top of the multi-layer stack 110.

The conductive layers 111-115 can be formed of a conductive semiconductor material, such as n-type poly-silicon, or n-type epitaxial single crystal silicon, doped with phosphorus or arsenic. Alternatively, the conductive layers 111-115 can be formed of p-type poly-silicon, or p-type epitaxial single crystal silicon, doped with boron. Still alternatively, the conductive layers 111-115 can be formed of un-doped semiconductor material, such as un-doped poly-silicon. In the present embodiment, the conductive layers 111-115 are preferably formed of un-doped poly-silicon.

The insulating layers 121-125 can be formed of a dielectric material such as silicon oxide, silicon nitride, silicon oxynitride, silicate, or others. The thickness of each one of the insulating layers 121-125 can be about 20 nm to 40 nm. In some embodiments of the present disclosure, the conductive layers 111-115 and the insulating layers 121-125 can be formed by a deposition process, for example, a low pressure chemical vapor deposition (LPCVD) process.

Figure 2:
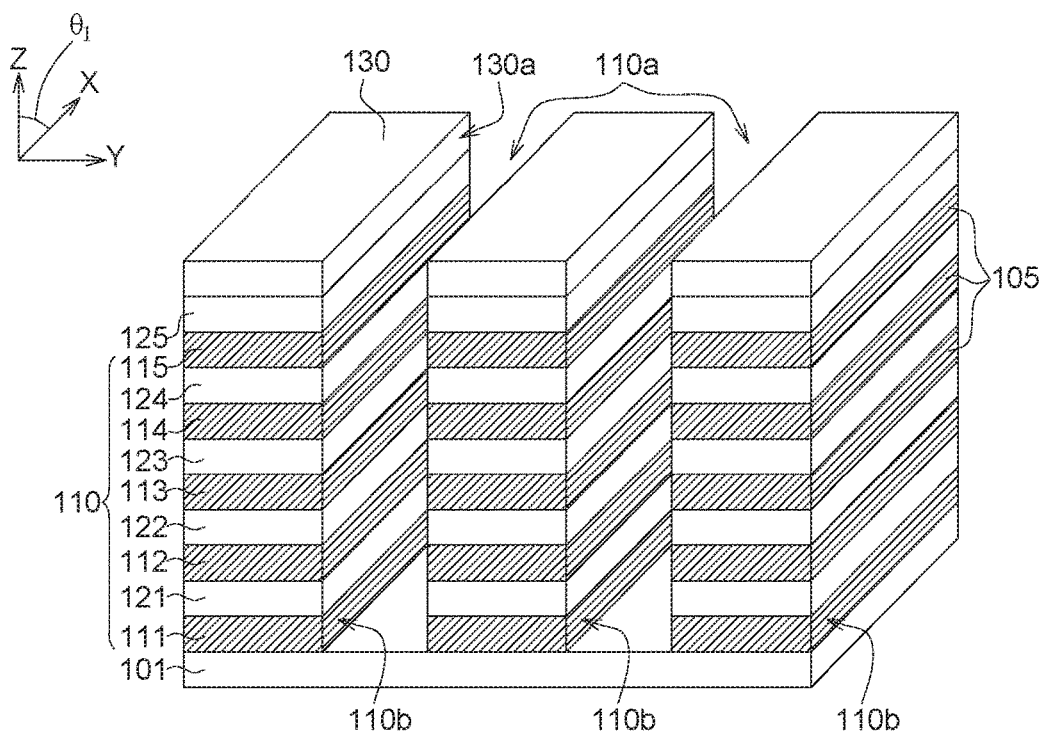
FIG. 2 is a prospective view illustrating the result after the process for patterning the multi-layer stack is performed on the structure depicted in FIG. 1.

Next, the multi-layer stack 110 is patterned to form a plurality of ridge-shaped stacks 110b. FIG. 2 is a prospective view illustrating the result after the process for patterning the multi-layer stack 110 is performed on the structure depicted in FIG. 1. In some embodiments of the present disclosure, the process for patterning the multi-layer stack 110 comprises steps as follows: A patterned hard mask layer 130 is firstly provided on a top surface of the multi-layer stack 110. In the present embodiment, the patterned hard mask layer 130 is formed on the top surface of the insulating layer 125, and comprises a plurality of trench openings 130a extending along the first direction (i.e. the Z-direction). Each of the trench openings 130a has a long axis extending along a third direction (such as the X orientation); and a portion of the top surface of the insulating layer 125 is exposed from the trench openings 130a. Wherein the first direction (i.e. the Z orientation) and the third direction (i.e. the X orientation) form a non-straight angle $\ominus 1$, such as about 90°.

In some embodiments of the present disclosure, the hard mask layer 130 may be an advanced patterning film (APF) formed by a chemical vapor deposition (CVD) process to deposit the APF over the entire top surface of the multi-layer stack 110. These trench openings 130a are formed by a photolithography process that removes portions of the APF. In the present embodiment, these trench openings 130a are each formed in (but not limited to) a square shape having the same size.

Thereafter, the multi-layer stack 110 is etched by using the patterned hard mask layer 130 as an etching mask, to form a plurality of trenches 110a extending along the first direction (the Z orientation) to expose portions of the substrate 101. Each of the trenches 110a have a long axle extending along the third direction (the X orientation) to divide the multi-layer stack 110 into a plurality of ridge-shaped stacks 110b. In the present embodiment, each of the ridge-shaped stacks 110b comprises a portion of the conductive layers 111-115 each of which is shaped as a conductive strip 105 used for connecting the memory cells of the 3D memory device 100 subsequently formed on a corresponding level of the multi-layer stack 110 in series.

Figure 3:
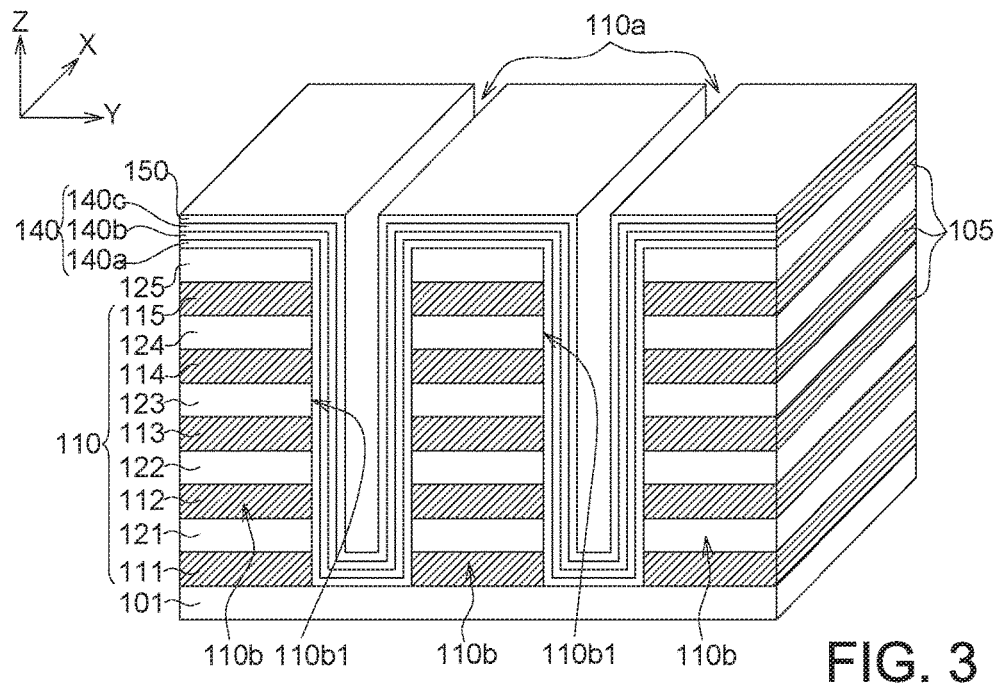
FIG. 3 is a prospective view illustrating the result after a memory material layer and a conductive layer are sequentially formed on the structure depicted in FIG. 2.

FIG. 3 is a prospective view illustrating the result after a memory material layer 140, a conductive layer 150 and an insulation material layer 160 are sequentially formed on the structure depicted in FIG. 2. In some embodiments of the present disclosure, the memory material layer 140, the conductive layer 150 and the insulation material layer 160 are sequentially formed by various LPCVD process, so as to conformally blanket over the surface of the ridge-shaped stacks 110b.

The memory material layer 140 may be formed of a composite layer (i.e., an ONO layer) including a silicon oxide layer 140a, a silicon nitride layer 140b, and a silicon oxide layer 140c, by a LPCVD process. In the present embodiment, the memory material layer 140 is formed in a manner of conformally blanket over the top surfaces and the vertical sidewalls 110b1 of the ridge-shaped stacks 110b as well as the bottoms (i.e., the surface of the substrate 101 that is exposed from the trenches 110a) of the trenches 110a. However, the structure of the memory material layer 140 is not limited to this regards. In some embodiments, the memory material layer 140 may be selected from a group consisting of an oxide-nitride-oxide-nitride-oxide, (ON-ONO) structure, a silicon-oxide-nitride-oxide-silicon (SO-NOS) structure, a bandgap engineered silicon-oxide-nitrideoxide-silicon (BE-SONOS) structure, a tantalum nitride-aluminum oxide-silicon nitride-silicon oxide-silicon (TANOS) structure and a metal-high-k bandgap-engineered silicon-oxide-nitride-oxide-silicon (MA BE-SONOS) structure.

The conductive layer 150 may include an electrically conductive material, such as n+-type poly-silicon (n-type epitaxial single crystal silicon) doped with phosphorus or arsenic, p+-type poly-silicon (p-type epitaxial single crystal silicon) doped with boron or un-doped polysilicon. Alternatively, the conductive layer 150 may be formed of silicide, such as TiSi, CoSi, or SiGe, oxide semiconductor, such as InZnO or InGaZnO, metal, such as Al, Cu, W, Ti, Co, Ni, TiN, TaN, or TaAlN, or a combination of two or more of these materials. The insulation material layer 160 may be made of a material including silicon dioxide.

Figure 4A:
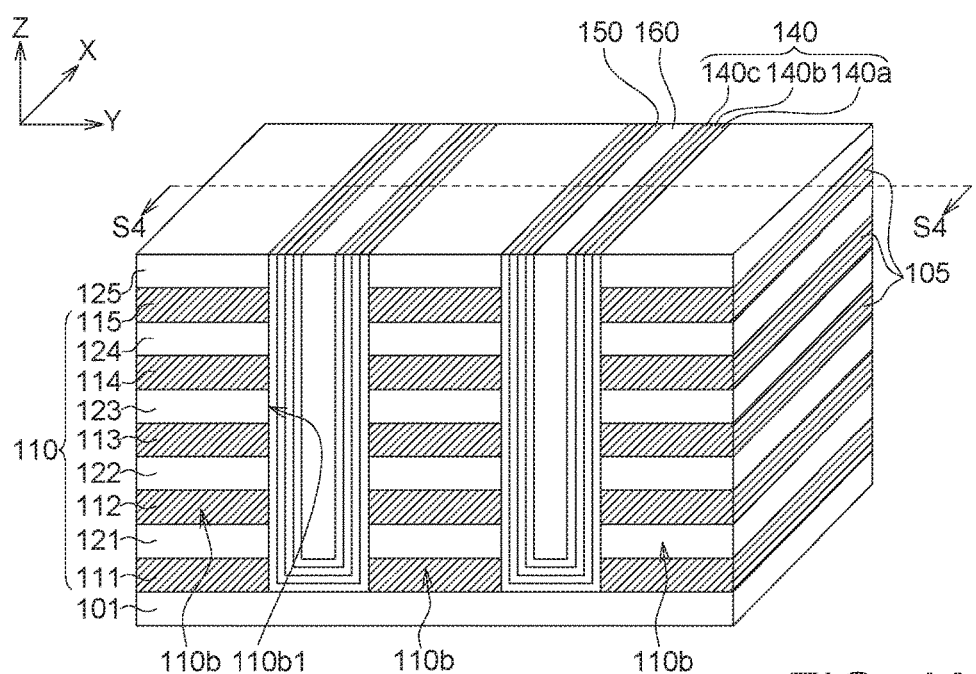
FIG. 4A is prospective view illustrating the result after a planarization process is formed on the structure depicted in FIG. 3.
Figure 4B:
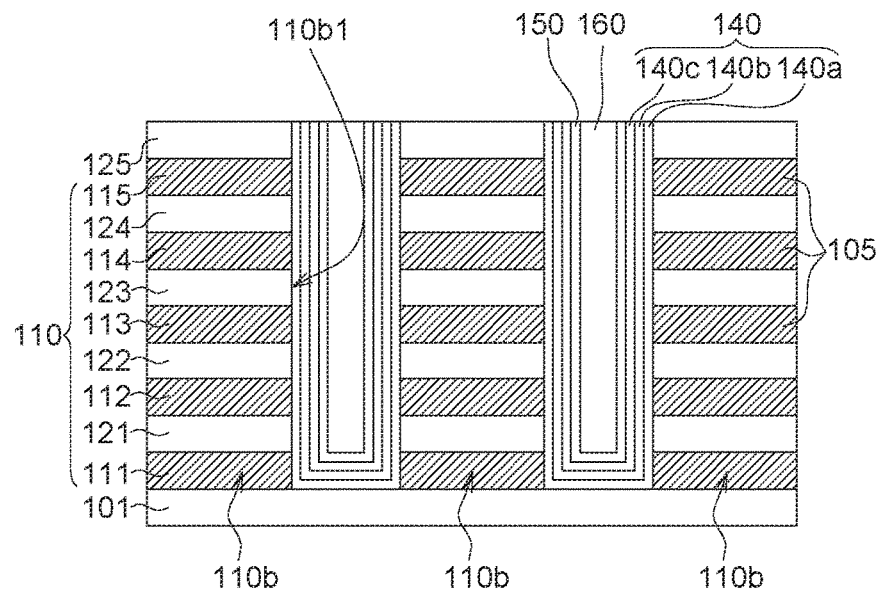
FIG. 4B is a cross-sectional view taken along the line S4 depicted in FIG. 4A.

A polarization process is then performed. FIG. 4A is prospective view illustrating the result after a planarization process is formed on the structure depicted in FIG. 3; and FIG. 4B is a cross-sectional view taken along the line S4 depicted in FIG. 4A. In the present embodiment, a chemical mechanical polishing (CMP) process is performed using the top insulating layers 125 of the ridge-shaped stacks 110b as a stop layer to remove the portions of the memory material layer 140, the conductive layer 150 and the insulation material layer 160 disposed on the top insulating layers 125 of the ridge-shaped stacks 110b, whereby the portions of the memory material layer 140, the conductive layer 150 and the insulation material layer 160 disposed in the trenches are remained. The remained portions of the memory material layer 140, the conductive layer 150 and the insulation material layer 160 can be regarded to as stacking on the vertical sidewall 110b1 of the ridge-shaped stacks 110b in sequence along a second direction (i.e. the Y orientation).

Figure 5A:
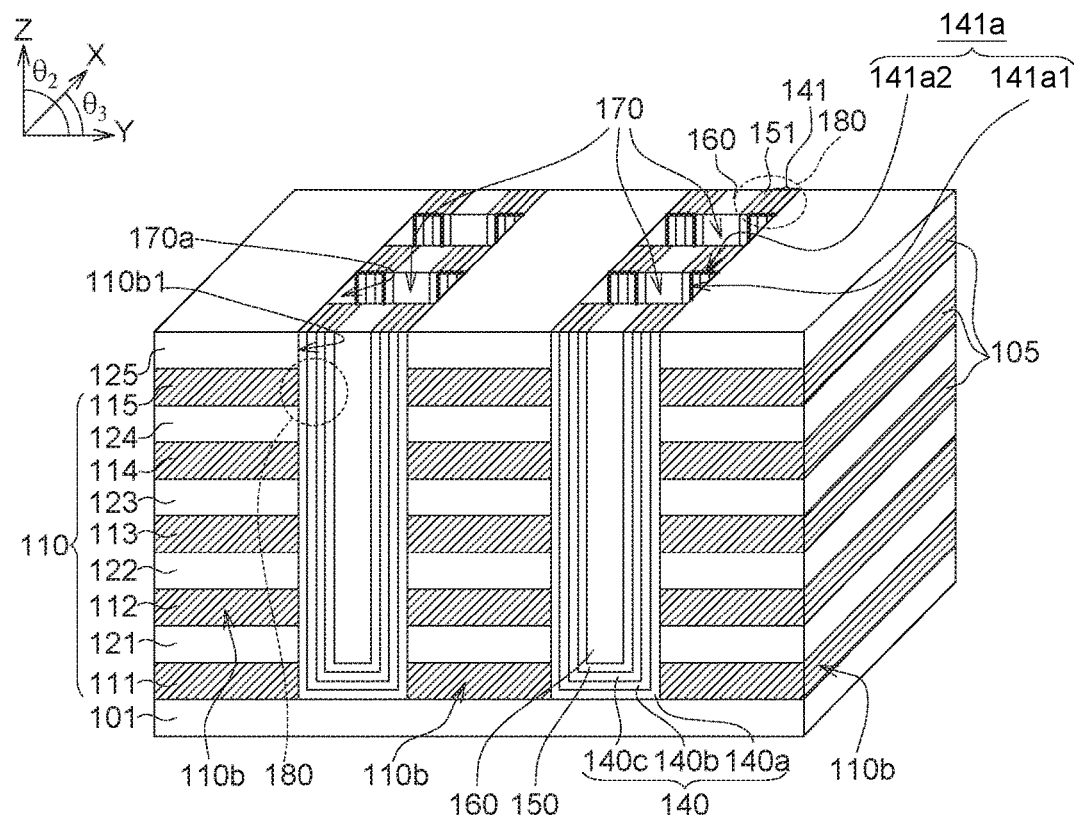
FIG. 5A is a prospective view illustrating the result after an open etch process is performed on the structure depicted in FIG. 4B.
Figure 5B:
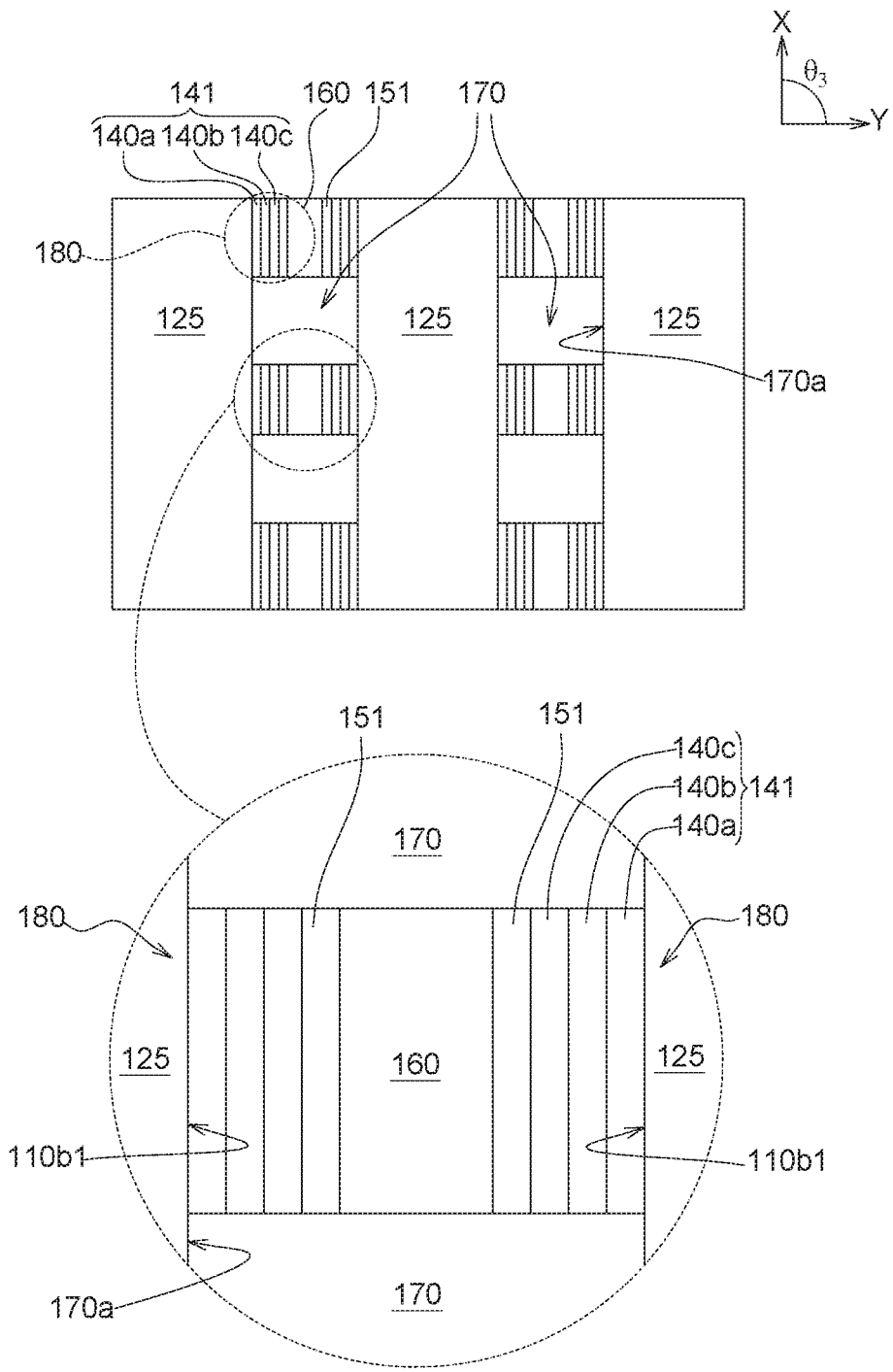
FIG. 5B is a top view of the structure depicted in FIG. 5A.

Subsequently, an opening etching process is performed to remove portions of the memory material layer 140, the conductive layer 150 and the insulation material layer 160 remained in the trenches 110a, so as to form a plurality of openings 170. FIG. 5A is a prospective view illustrating the result after an open etch process is performed on the structure depicted in FIG. 4B; and FIG. 5B is a cross-sectional view taken along the line S5 depicted in FIG. 5A.

In the present embodiment, the openings extend along the first direction (the Z orientation) in one way and extend along a third direction (the X orientation) in another way to remove portions of the memory material layer 140, the conductive layer 150 and the insulation material layer 160 remained in the trenches 110a and to expose portions of the substrate 101. As a result, the remained portions of the memory material layer 140, the conductive layer 150 and the insulation material layer 160 can be divided into a plurality of regions arranged in lines parallel to the third direction (the X orientation), wherein a non-straight angle non-straight angle ⊖2 (e.g. about 90°) can be formed by the second direction (Y orientation) and the first direction (the Z orientation), a non-straight angle non-straight angle ⊖3 (e.g. about 90°) can be formed by the third direction (the X orientation) and the second direction (Y orientation).

A memory cell 180 thus can be formed by the remained memory material layer 140 (thereinafter referred to as a memory layer 141) and the remained conductive layer 150 (thereinafter referred to as a channel layer 151) in each region and the corresponding conductive stripe 105 disposed on each level of the ridge-shaped stacks 110b on the intersection point thereof. And the memory cells 180 can be electrically connected in series along the first direction (the Z orientation) by the remained conductive layer 150, so as to form a U shaped cell string between two adjacent ridge-shaped stacks 110b. In the present embodiment, the memory layer 141 has a narrow sidewall 141a exposed from at least one of the openings 170, and the narrow sidewall 141a has a long side 141a1 extending along the first direction (the Z orientation) and a narrow side 141a2 extending along the second direction (Y orientation) (see FIG. 5A).

Figure 6A:
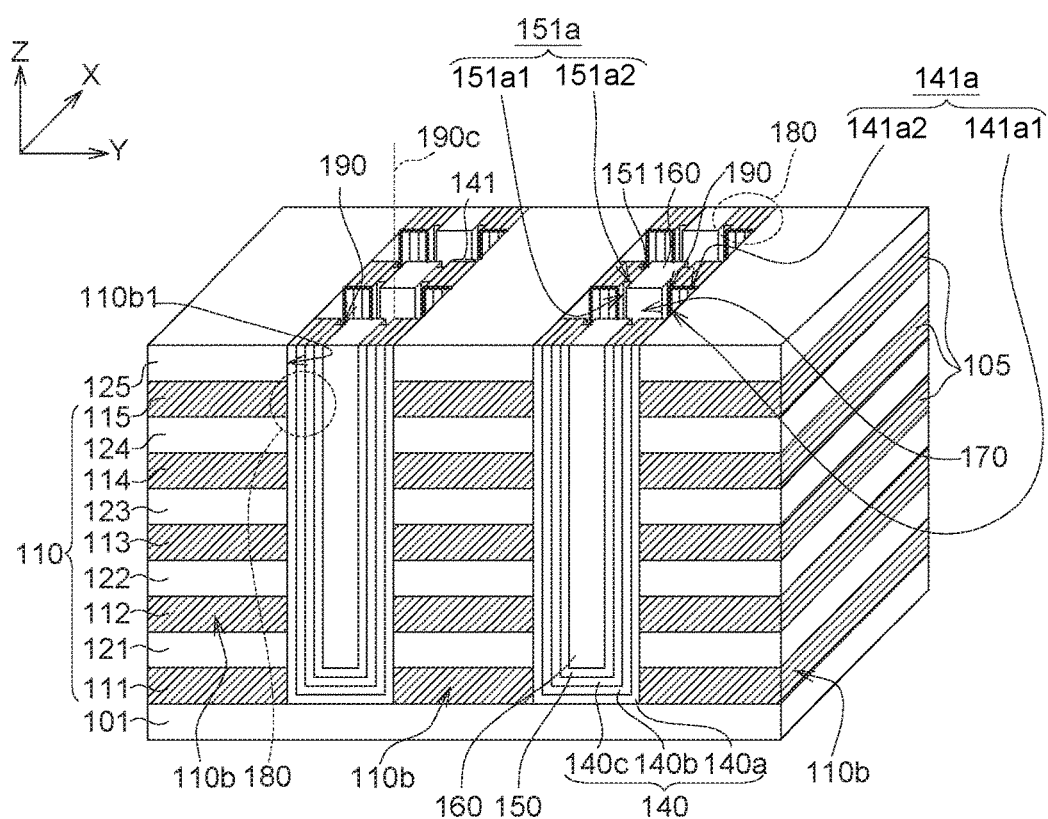
FIG. 6A is a prospective view illustrating the result after an channel etch back process is performed on the structure depicted in FIG. 5A.
Figure 6B:
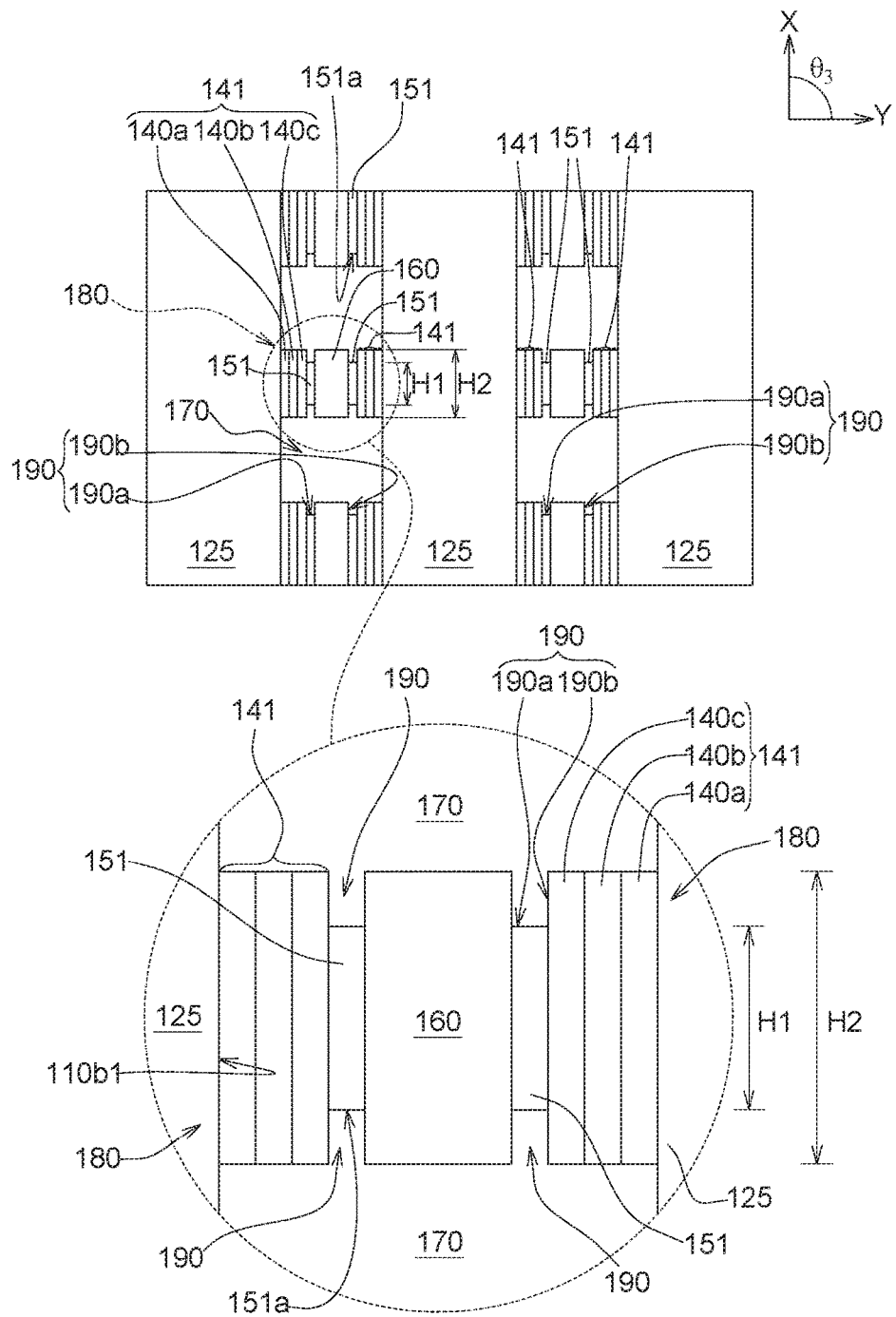
FIG. 6B is a top view of the structure depicted in FIG. 6A.

A channel etch back process is next performed to remove a portion of the channel layer 151. FIG. 6A is a prospective view illustrating the result after a channel etch back process is performed on the structure depicted in FIG. 5A; and FIG. 6B is a top view of the structure depicted in FIG. 6A. A portion of the channel layer 151 is removed by the channel etch back process along the third direction (the X orientation) from the opening 170, so as to expose a narrow sidewall 151a of the channel layer 151. A narrow notch 190 with a long axel 190c parallel to the first direction (the Z orientation) is thus defined by the narrow sidewall 151a, the remained memory layer 141 and the insulation material layer 160, wherein the narrow sidewall 151a of the channel layer 151 may serve as the bottom of the narrow notch 190. In other words, the narrow sidewall 151a of the channel layer 151 has a long side 151a1 extending along the first direction (the Z orientation) and a narrow side 151a2 extending along the second direction (Y orientation). In the present embodiment, the channel layer 151 in each memory cell 180 has a width H1 parallel to the third direction (the X orientation) substantially less than the width H2 parallel to the third direction (the X orientation) of the memory layer 141.

Figure 7A:
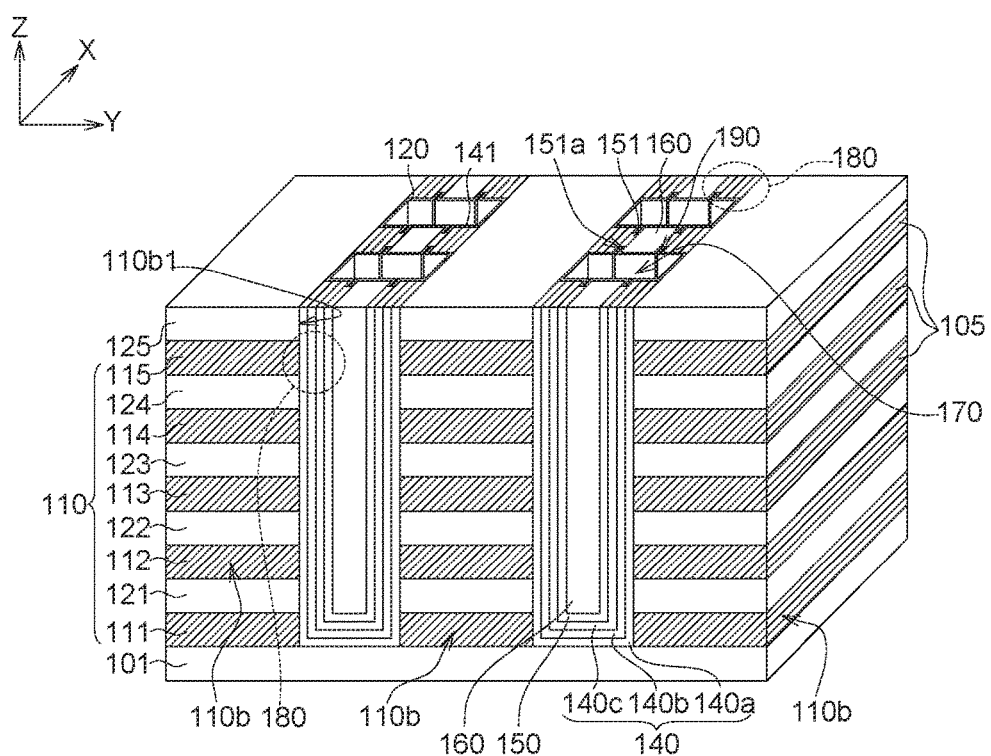
FIG. 7A is a prospective view illustrating the result after a silicon oxide lining layer is formed on the structure depicted in FIG. 6A.
Figure 7B:
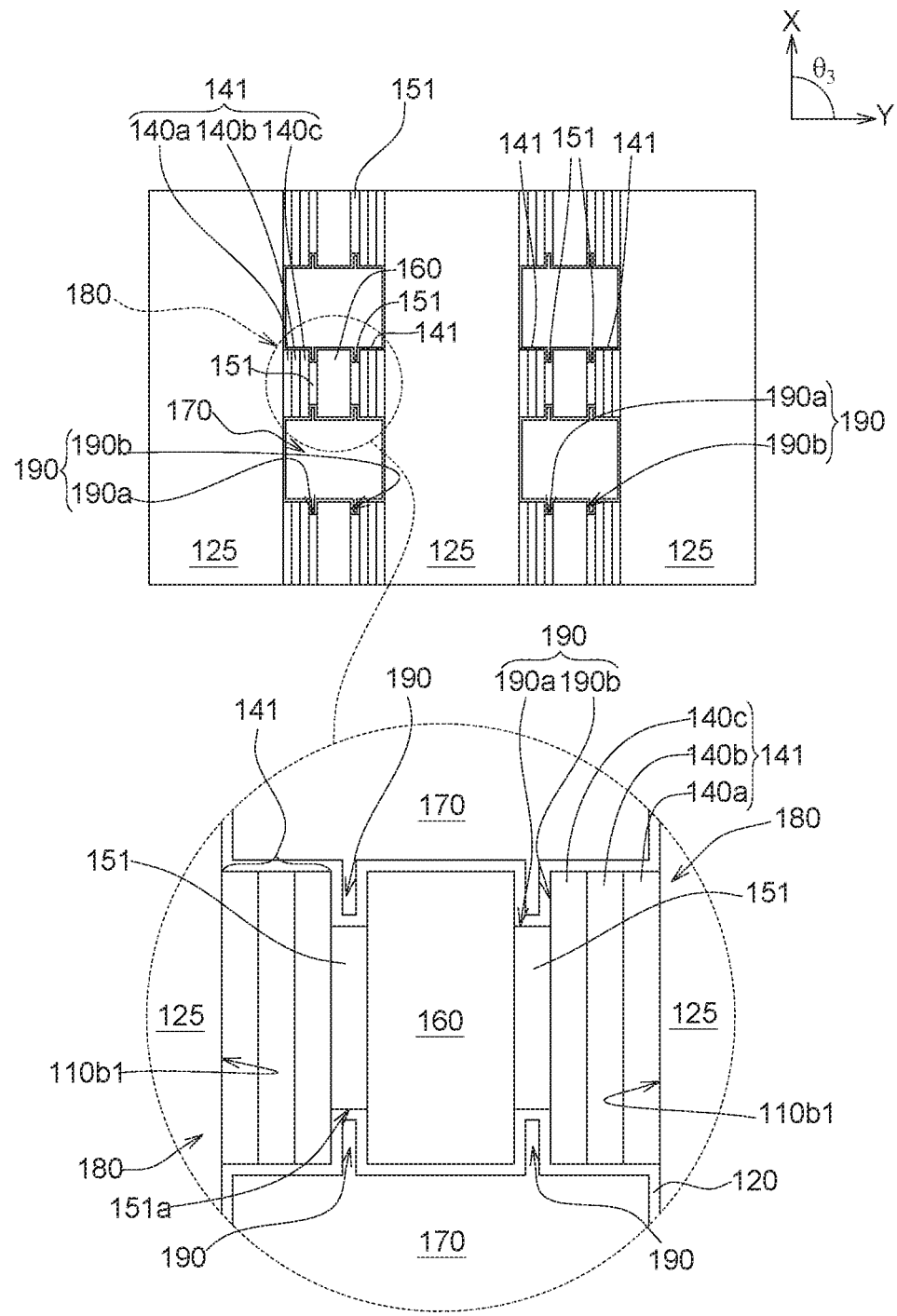
FIG. 7B is a cross-sectional view taken along the line S7 depicted in FIG. 7A.

Next, an optional silicon oxide lining layer 120 can be formed on the sidewalls 170a of the opening 170. FIG. 7A is a prospective view illustrating the result after a silicon oxide lining layer 120 is formed on the structure depicted in FIG. 6A; and FIG. 7B is a top view of the structure depicted in FIG. 7A. For the purpose of providing a clear description, the portion of the silicon oxide lining layer 120 disposed on the on the top surface of the insulating layer 125 may be omitted. In some embodiments of the present disclosure, the silicon oxide lining layer 120 may be a silicon dioxide layer formed by a thermal oxidation process or a deposition process. The silicon oxide lining layer 120 partially covers the sidewalls of the memory layer 141, the channel layer 151 and the insulation material layer 160 and extends onto the sidewalls 190b and bottom 190a of the narrow notch 190.

Figure 8A:
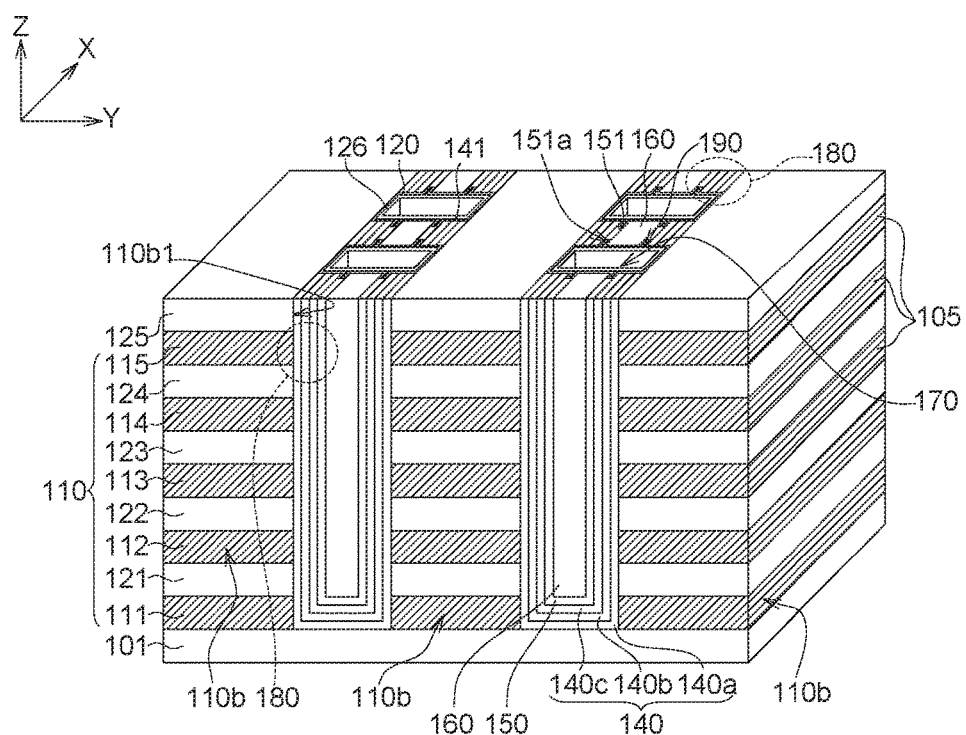
FIG. 8A is a prospective view illustrating the result after a silicon nitride capping layer is formed on the structure depicted in FIG. 7A.
Figure 8B:
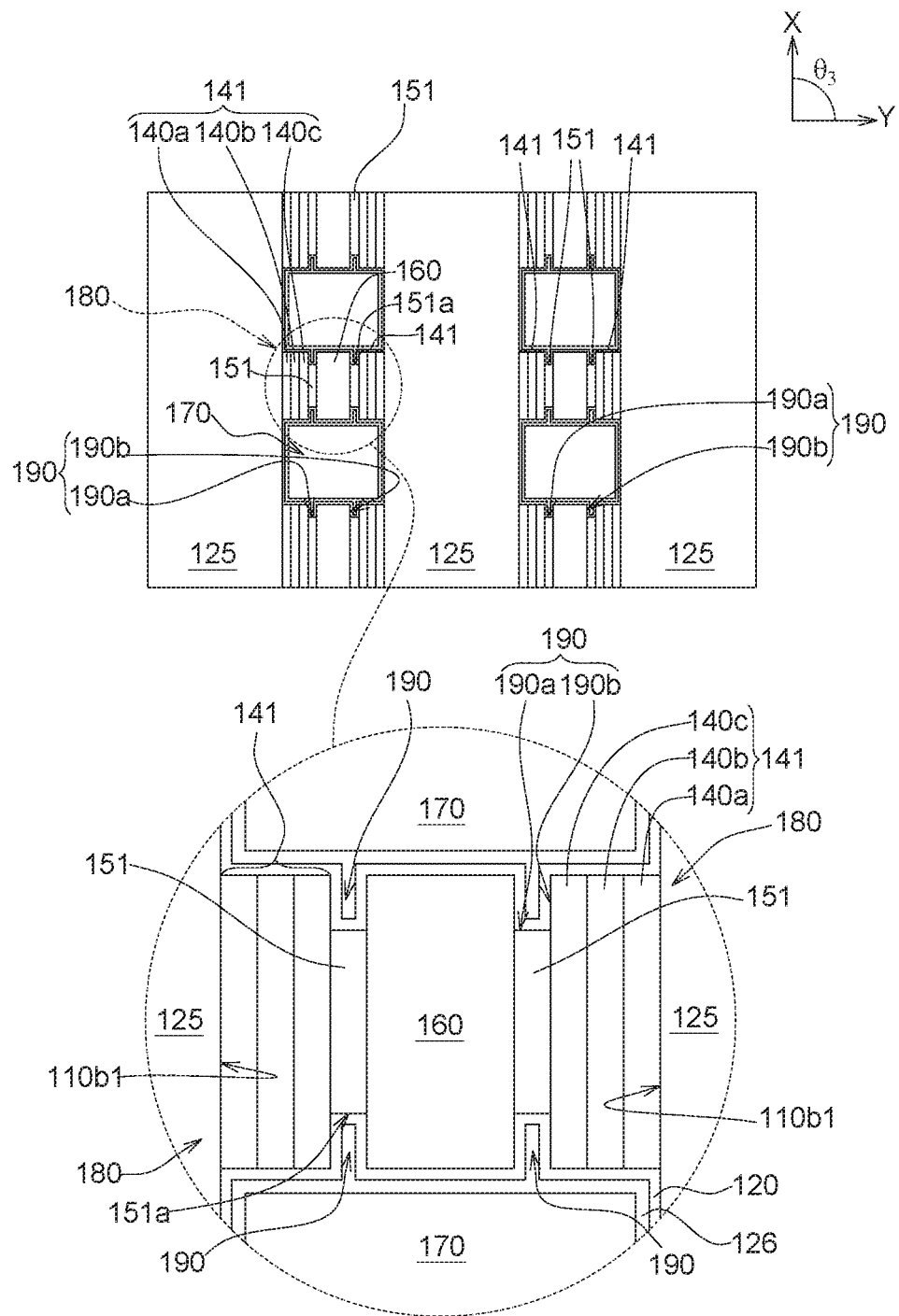
FIG. 8B is a cross-sectional view taken along the line S8 depicted in FIG. 8A.

A silicon nitride capping layer 126 is then formed on the silicon oxide lining layer 120. FIG. 8A is a prospective view illustrating the result after a silicon nitride capping layer is formed on the structure depicted in FIG. 7A: FIG. 8B is a top view of the structure depicted in FIG. 8A. For the purpose of providing a clear description, the portions of the silicon oxide lining layer 120 and the silicon nitride capping layer 126 disposed on the on the top surface of the insulating layer 125 may be omitted. In some embodiments of the present disclosure, the forming of the silicon nitride capping layer 126 includes steps as follows: A silicon nitride layer is firstly formed on the sidewalls 170a of the opening 170 and extending into the narrow notch 190. Whereby the portions of the silicon oxide lining layer 120 and the silicon nitride capping layer 126 can be regarded to as being stacked in sequence on the bottom 190a of the narrow notch 190 along the third direction (the X orientation).

Figure 9A:
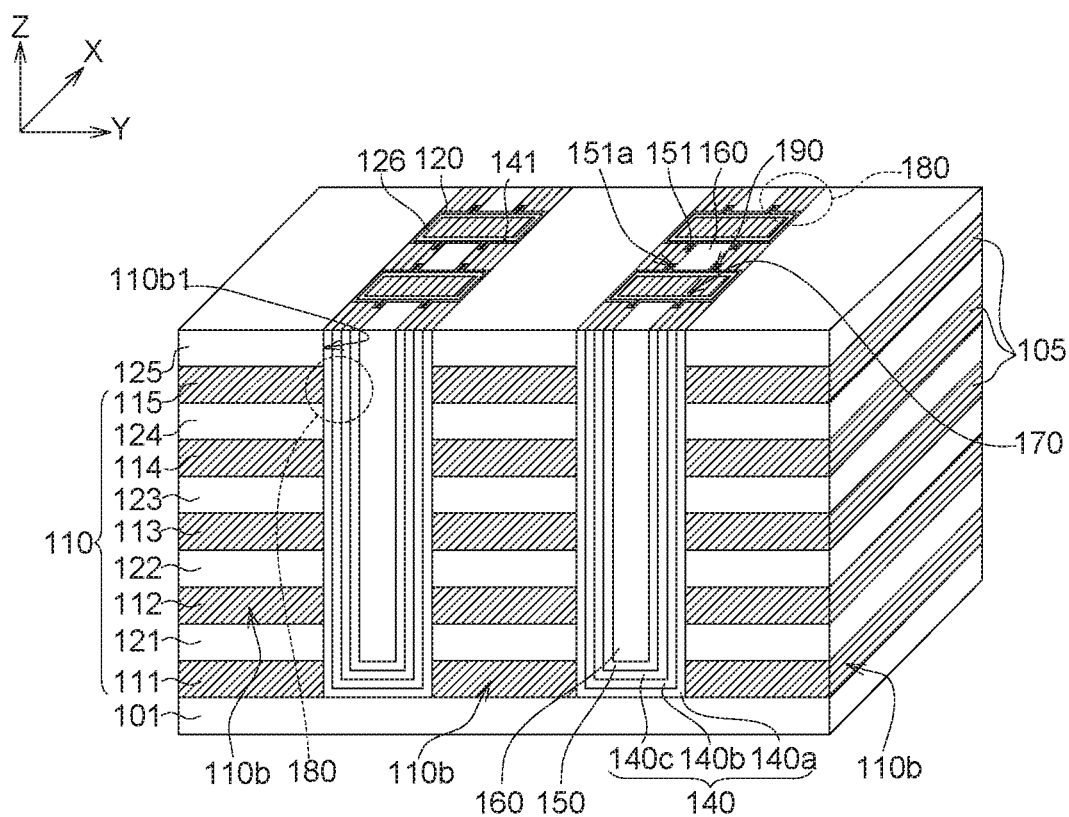
FIG. 9A is a prospective view illustrating the result after another planarization process is performed on the structure depicted in FIG. 8A.
Figure 9B:
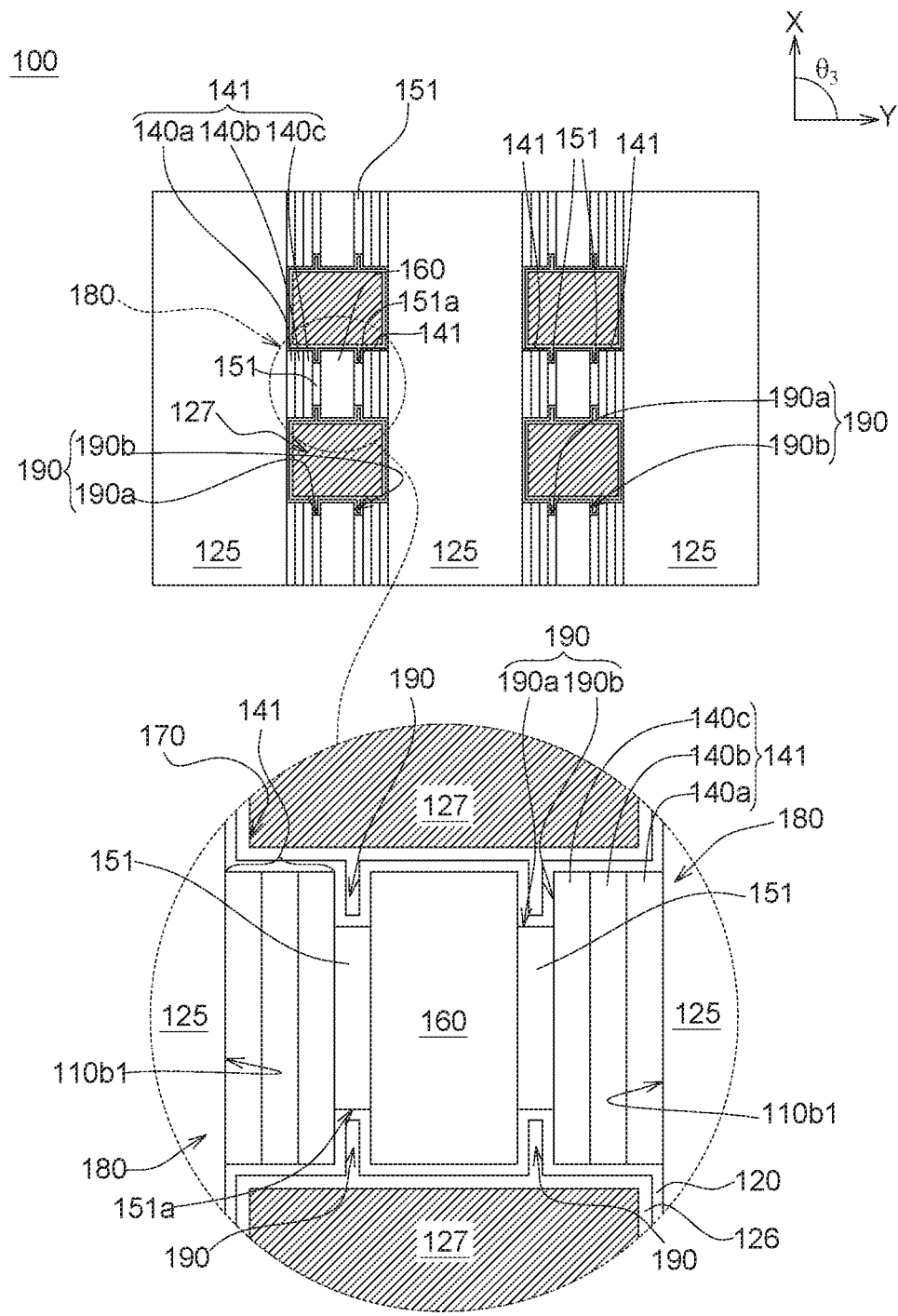
FIG. 9B is a cross-sectional view taken along the line S9 depicted in FIG. 9A.

Thereinafter, an insulating material 127 is formed and another planarization process is then performed. FIG. 9A is a prospective view illustrating the result after another planarization process is performed on the structure depicted in FIG. 8A; and FIG. 9B is a top view of the structure depicted in FIG. 9A. In the present embodiment, the insulating material 127 includes silicon oxide and fulfills the opening 170, and the portions of the insulating material 127 disposed on the top surface of the insulating layer 125 may be removed by the planarization process, whereby portions of the memory layer 141 and the channel layer 151 can be exposed.

After a series of back end processes to form a plurality of metal contacts and other wires, such as word lines, common source lies and bit lines (not shown), the 3D memory device 100 can be obtained.

In the present embodiment, since the channel layer 151 of each memory cell 180 is etched back along the third direction (the X orientation) to form two narrow notches 190 having long axles 190c parallel to the first direction (the Z orientation), thus the narrow sidewalls 151a disposed on the lateral edges of the channel layer 151 can separated from the narrow sidewalls 141a disposed on the lateral edges of the memory layer 141. The impact of corner effect occurring at the lateral edges of the memory layer 141 can be alleviated, and the problems of degradation in electrical properties and memory write/read failure due to the corner effect can be obviated.

In some embodiments of the present disclosure, the depth of the narrow notch 190 measured from the bottom 190a along the third direction (the X orientation) may decrease gradually along the first direction (the Z orientation) towards to the substrate 101, since the narrow notch 190 is formed by the process of etching back the channel layer 151. Such that, the way of applying the narrow notch 190 to alleviate the impact of corner effect on a memory cell 180 is rather dependent upon the level of the ridge-shaped stacks 110b where the memory cell 180 is disposed.

Figure 10:
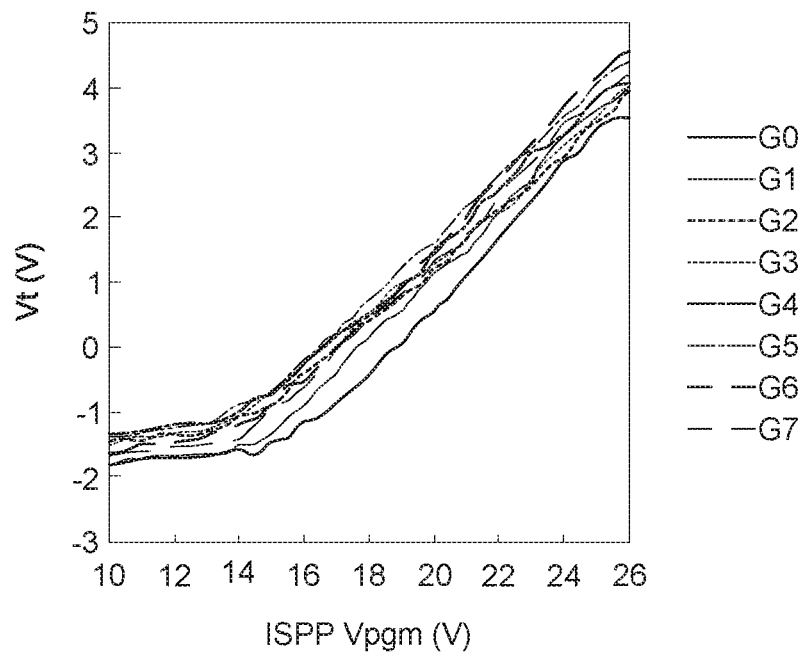
FIG. 10 is a schematic diagram illustrating program voltage (Vpgm)-threshold voltage (Vt) relationship of the memory cells disposed at different levels of the ridge-shaped stacks in the 3D memory device according to one embodiment of the present disclosure.

For example, FIG. 10 is a schematic diagram illustrating Vpgm-Vt relationship of the memory cells 180 disposed at different levels of the ridge-shaped stacks 110b in the 3D memory device 100 according to one embodiment of the present disclosure. Curves G0 to G7 represents the Vpgm-Vt relationship of the memory cells 180 respectively disposed on different levels of the ridge-shaped stacks 110b along the first direction (the Z orientation) counted from the substrate 101. Curves G0 and G1 deviate from curves G2 to G7. It can be indicated that memory cells 180 disposed the levels of the ridge-shaped stacks 110b adjacent to the substrate 101 may not get rid of the corner effect, because of the fact that the depth of the narrow notch 190 formed in these memory cells is too shallow to separate the lateral edges of the channel layer 151 from that of the memory layer 141. In some embodiments of the present disclosure, the depth of the narrow notch 190 measured along the third direction (the X orientation) from the bottom 190a thereof may range from 5 nanometers (nm) to 10 nm, and preferably is about 6 nm.

In addition, because the first silicon oxide layer 140a of the memory layer 141, the silicon nitride capping layer 126 and the silicon oxide lining layer 120 may form another ONO composite layer to cover the lateral edges of the channel layer 151 as well as the bottom 190a and the sidewalls 190b of the narrow notch 190. More electrons may be trapped to repress gate injection, whereby the threshold voltage of the memory cells 180 can be increased to avoid memory write/read failure due to unwanted turn-on during the write/read operation.

Figure 11:
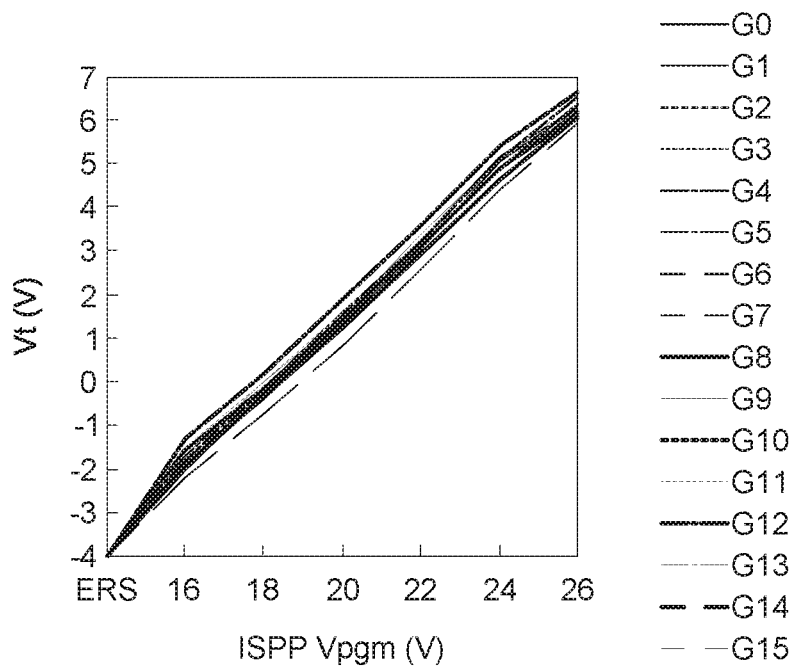
FIG. 11 is a schematic diagram illustrating Vpgm-Vt relationship of the memory cells disposed at different levels of the ridge-shaped stacks in the 3D memory device according to another embodiment of the present disclosure.

FIG. 11 is a schematic diagram illustrating Vpgm-Vt relationship of the memory cells 180 disposed at different levels of the ridge-shaped stacks 110b in the 3D memory device 100 according to another embodiment of the present disclosure. Curves G0 to G15 represents the Vpgm-Vt relationship of the memory cells 180 respectively disposed on different levels of the ridge-shaped stacks 110b along the first direction (the Z orientation) counted from the substrate 101. The Vpgm-Vt relationship of these memory cells 180 that have the silicon oxide lining layer 120 and the silicon nitride capping layer 126 covering on the lateral edges of the channel layer 141 are rather coincide with each other. It is indicated that the impact of corner effect occurring at each memory cell 180 can be alleviated by applying the silicon oxide lining layer 120 and the silicon nitride capping layer 126 with even thickness to cover the lateral edges of the channel layer 141. The advantages provided by the silicon oxide lining layer 120 and the silicon nitride capping layer 126 may not vary by the positions or levels where the memory cell 180 are disposed.

In accordance with the aforementioned embodiments of the present disclosure, a 3D memory device and the method for fabricating the same are provided. A memory layer and a channel layer are formed in sequence on a vertical sidewall of a ridge-shaped stack including a plurality of conductive strips. A lateral narrow sidewall of the channel layer is next etched back. A silicon nitride capping layer is then formed to cover the etched lateral narrow sidewall of the channel layer. Whereby, the lateral narrow sidewall of the channel layer can be separated from the lateral edges of the memory layer, and more electrons can be trapped in the silicon nitride capping layer, and the impact of the corner effect occurring at the lateral edges of the memory layer can be alleviated. As a result, the problems of degradation in electrical properties and memory write/read failure due to the corner effect can be obviated.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A three-dimensional (3D) memory device, comprising:
   a substrate;
   a ridge-shaped stack, including a plurality of conductive strips stacked on the substrate along a first direction;
   a memory layer, stacked on a vertical sidewall of the ridge-shaped stack along a second direction that forms a non-straight angle with the first direction, and having a first narrow sidewall with a first long side extending along the first direction and a first narrow side extending along the second direction;
   a channel layer, stacked on the memory layer along the second direction, the channel layer having a portion recessed in a third direction by an etch back process to form a second narrow sidewall having a second long side extending along the first direction and a second narrow side extending along the second direction, wherein the first narrow sidewall is separated from the second narrow sidewall along the third direction, and the third direction forms a non-straight angle with both the first direction and the second direction; and
   a capping layer stacked on the second narrow sidewall along the third direction.

2. The 3D memory device according to claim 1, wherein the memory layer comprises a first silicon oxide layer, a silicon nitride layer and a second silicon oxide layer stacked in sequence on the vertical sidewall along the second direction.

3. The 3D memory device according to claim 2, wherein the channel layer has a first width extending along the third direction; the memory layer has a second width extending along the third direction; and the first width is less than the second width.

4. The 3D memory device according to claim 2, further comprising an insulation material layer stacked on the channel layer along the second direction; a narrow notch extending along the first direction is defined by the channel layer, the insulation material layer and the second silicon oxide layer; and the narrow sidewall serves as a bottom of the narrow notch.

5. The 3D memory device according to claim 4, wherein the capping layer extends into the narrow notch.

6. The 3D memory device according to claim 4, wherein the narrow notch has a depth substantially ranging from 5 nanometer (nm) to 10 nm measured from the bottom along the third direction.

7. The 3D memory device according to claim 2, further comprising a silicon oxide lining layer disposed between the channel layer and the capping layer.

8. The 3D memory device according to claim 2, wherein the capping layer extends both along the first direction and the second direction to cover the channel layer and the memory layer.

* * * * *